United States Patent

[11] 3,622,842

[72] Inventor Avtar S. Oberai
Wappingers Falls, N.Y.
[21] Appl. No. 888,428
[22] Filed Dec. 29, 1969
[45] Patented Nov. 23, 1971
[73] Assignee International Business Machines Corporation
Armonk, N.Y.

[54] SEMICONDUCTOR DEVICE HAVING HIGH-SWITCHING SPEED AND METHOD OF MAKING
13 Claims, 7 Drawing Figs.

[52] U.S. Cl. .......... 317/235 R, 317/234 R, 317/235 E, 317/235 AM, 317/235 Y, 29/569, 148/175, 148/186
[51] Int. Cl. .......... H01l 19/00
[50] Field of Search .......... 317/235 (22), 235 (22.1), 235 (22.11)

[56] References Cited
UNITED STATES PATENTS
3,506,893 4/1970 Dhaka .......... 317/235

*Primary Examiner*—John W. Huckert
*Assistant Examiner*—B. Estrin
*Attorneys*—Hanifin and Jancin and Frank C. Leach, Jr.

ABSTRACT: A transistor of a monolithic integrated circuit has its switching speed increased by reducing the parasitic collector capacitance through reducing the junction area between the base and the subcollector. By controlling the thickness and impurity concentration of a layer into which the subcollector region is diffused to prevent punch through of the base to the substrate of the same conductivity as the base or a layer, which is on the substrate, of the same conductivity as the base and beneath the controlled layer, the subcollector region need be positioned only beneath the emitter region and not the entire area of the base region.

INVENTOR
AVTAR S. OBERAI

BY Frank C. Leach Jr.

ATTORNEY

SEMICONDUCTOR DEVICE HAVING HIGH-SWITCHING SPEED AND METHOD OF MAKING

In the fabrication of monolithic integrated circuits, a subcollector is formed in a layer having the same conductivity as the subcollector but of lower concentration. This layer is formed on a layer of opposite conductivity, which is formed on the upper surface of the substrate having the same conductivity as the subcollector. If the substrate should be of the opposite conductivity to the subcollector region, then the layer of opposite conductivity is omitted, and the layer of lower concentration than the subcollector is formed on the upper surface of the substrate. The subcollector is employed to reduce the series resistance of the collector to a relatively low-value and is employed to increase the switching speed of the transistor by providing a relatively steep gradient at the collector-base junction. This steeper gradient at the collector-base junction is necessary for higher current carrying capability of the transistor.

The subcollector has previously been extended beneath the entire bottom area of the base region of the transistor to prevent any punch through from the base to the layer or the substrate, which has the same conductivity as the base region, on which the subcollector is formed. If punch through occurs, the transistor becomes shorted, and the transistor is of no value.

While the use of the subcollector has substantially reduced the collector resistance and provided higher current carrying capability so as to increase the switching speed of the transistor, a relatively large junction area exists between the subcollector and the base. This junction are produces a parasitic collector-base capacitance, which normally exceeds the parasitic capacitance between the collector and the isolation region. This capacitance has an effect on the switching speed of the transistor; thus, even though a lowered series resistance and increased current carrying capability due to the subcollector, which forms the collector of the transistor, enables the switching speed of the transistor to be increased substantially, the capacitance of the collector to the base still has a significant effect on the switching speed of the transistor.

The present invention satisfactorily overcomes the foregoing problem of the relatively large collector capacitance while still obtaining a relatively low-collector resistance and increased current carrying capability so that the switching speed of the transistor can be increased substantially. The present invention reduces the area of the subcollector to lower the collector to base capacitance and the collector to isolation capacitance. In the present invention, the collector to base capacitance can be reduced by about 40 percent, and the collector to isolation capacitance can be decreased by about 30 percent. Therefore, this substantial decrease in the capacitance of the subcollector has a significant effect on the switching speed of the transistor. Thus, the foregoing reductions in capacitance can produce an increase in the transistor switching speed of about 20 percent.

The present invention satisfactorily reduces the junction area between the base and the subcollector of the transistor by decreasing the area of the subcollector without allowing punch through between the base and the layer of the same conductivity as the base on the upper surface of the substrate when the substrate is of opposite conductivity to the base or between the base and the substrate when the substrate is of the same conductivity as the base. The present invention accomplishes this by forming a layer of the same conductivity as the subcollector on the surface of the layer of opposite conductivity on the substrate when the substrate is of the same conductivity as the subcollector or on the upper surface of the substrate when the substrate is of opposite conductivity to the subcollector and selecting the thickness and concentration of this layer of the same conductivity as the subcollector so that the layer is sufficient along with the distance from the bottom of the base region to the top of this layer to sustain the punch through voltage.

In addition to not adversely affecting the punch through voltage, the reduction in the junction area between the base and the subcollector must also not adversely affect other parameters of the transistor. For example, the break down voltage and the current carrying capability of the transistor must not be affected by the reduction in the junction area. Through positioning the subcollector region directly beneath the entire emitter region, there is no effect on the current carrying capability of the transistor or the break down voltage.

The present invention has particular utility when the base region has two ohmic contacts since this requires the base region to extend a substantial distance on opposite sides of the emitter region. While the use of two ohmic contacts for the base region functions to increase the switching speed of the transistor, this has previously required an increased subcollector area whereby the parasitic capacitances have increased to reduce the switching speed of the transistor so that the maximum effect of increased switching speed due to the two ohmic contacts with the base region is not obtained. However, with the present invention, the subcollector area does not need to be the same as the area of the base region. Therefore, the present invention enables one to obtain the advantages of both the subcollector and the two ohmic contacts for the base region whereby a faster switching transistor is obtained.

Since it is only necessary for the subcollector region to be disposed beneath the emitter region to have the desired current flow between the emitter, the base, and the subcollector, it is not necessary for the subcollector to extend for the width of the base region except in the area in which the subcollector is disposed beneath the emitter region and in the area in which the subcollector is extended to the surface of the device for an ohmic contact. Accordingly, the junction area between the base and the subcollector can be reduced even further by utilizing only a narrow connecting portion of the subcollector between the portion of the subcollector region beneath the emitter region and the portion of the subcollector region that allows an ohmic contact to be made thereto. This results in a further decrease in the collector to base and collector to isolation parasitic capacitances.

While this reduction in the width of the subcollector region between the portion of the subcollector region beneath the emitter region and the portion of the subcollector region utilized for ohmic contact results in a decrease in the capacitance, it causes an increase in the series resistance of the subcollector. This is because the resistance of the subcollector is directly proportional to its sheet resistivity and its length and is inversely proportional to its area so that a decrease in the area, due to decreasing the width of the subcollector region intermediate its ends, produces an increase in the series resistance since the length of the subcollector region does not change. However, the increase in the series resistance does not reduce the switching speed of the transistor as much as the switching speed of the transistor is increased due to the lowered parasitic capacitance resulting from the smaller junction area between the base and the subcollector.

It has previously been suggested to use a pedestal structure for obtaining high speed switching of a transistor. In the pedestal structure, it is necessary to form second subcollector regions extending upwardly from the main subcollector region with one of the second subcollector regions forming the junction with the base region and the other of the second subcollector regions extending to the surface of the device for the ohmic contact.

This is a very small junction area between the subcollector and the base so that the parasitic capacitance of the collector to base is substantially reduced. However, this necessitates a second diffusion for the subcollector. Furthermore, it requires a second diffusion for the isolation region. Therefore, additional processing steps are required to form the pedestal structure. These increase both the cost and the time for fabrication.

The present invention eliminates the extra processing steps of the pedestal structure while still obtaining a reduced collector capacitance by forming a structure, similar to a pedestal structure, in which the device has substantially the same capacitance as the pedestal structure without the requirement of the extra processing steps. The present invention accomplishes this by forming the emitter region adjacent one side of the base region and closest to the portion of the subcollector region having the ohmic contact. By not having the subcollector region disposed beneath the portion of the base region extending beyond the emitter region on the side away from the portion of the subcollector region having the ohmic contact, there is only a small junction area between the base region and the subcollector region. This results in the same type of reduced collector capacitance as is obtainable in a pedestal structure without the additional processing steps.

The present invention also has utility in various other types of complicated integrated circuits. For example, the junction area between the subcollector and the base could be reduced in a semiconductor device of the type having a buried decoupling capacitor and channels for power distribution. In this type of structure, it would only be necessary to change the upper half of the epitaxial layer as it is deposited on the buried decoupling capacitor within the substrate. This would provide the desired layer to prevent punch through.

An object of this invention is to provide an integrated circuit device having a fast switching speed and a method of making.

Another object of this invention is to provide a transistor having a substantially lower collector capacitance and a method of making.

The foregoing and other objects, features, and advantages of the invention will be more apparent from the following more particular description of the preferred embodiments of the invention as illustrated in the accompanying drawings.

Figure 1:
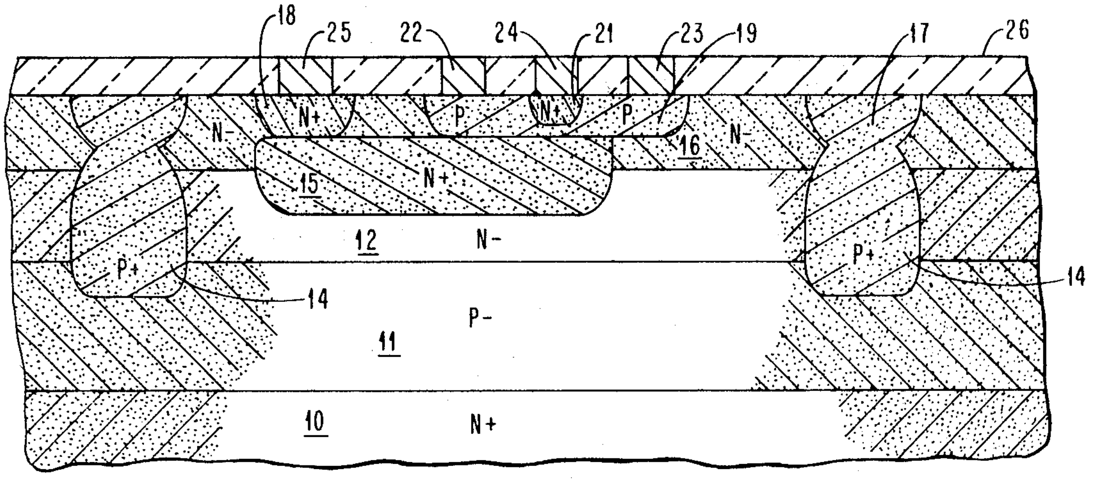
FIG. 1 is a sectional view of a portion of a monolithic semiconductor structure formed in accordance with the present invention.
Figure 2:
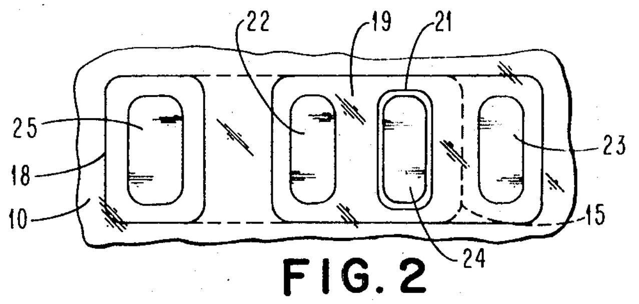
FIG. 2 is a top plan view of a portion of the semiconductor structure of FIG. 1.

Referring to the drawings and particularly FIGS. 1 and 2, there is shown a substrate 10 of monocrystalline silicon. The substrate 10 is preferably arsenic doped to a concentration of $5\times10^{18}$ atoms/cm.$^3$ so as to have N+ type conductivity.

The upper surface of the substrate 10 has a layer 11 of P− conductivity grown thereon so as to be epitaxial whereby it has the same crystalline orientation as the substrate 10. Any well-known process may be employed for forming the epitaxial layer 11 of about 3 to 3.5 microns thickness.

As one specific example, the epitaxial layer 11 can be grown at 1150° C. by the introduction of diborane and silane in an epitaxial reactor. Since the N+ impurities in the substrate 10 diffuse outwardly into the layer 11 and tend to convert the P− layer 11 to N−, it is necessary to control the introduction of diborane.

A layer 12 of N− conductivity is formed on top of the layer 11. The layer 12 is epitaxially grown so that it has the same crystalline orientation as the substrate 10. The thickness of the epitaxial layer 12 is about 2 to 2.5 microns.

The layers 11 and 12 could be simultaneously formed if desired. To accomplish this, it would be necessary to control the diborane level within the epitaxial reactor so that the ratio of boron to silicon is initially in the order of $10^{'7E'4}$ to $10^{'7E'5}$. After a predetermined period of time, the supply of diborane is reduced so that the ratio of boron to silicon is in the order of $10^{'7E'7}$ to $10^{'7E'8}$.

By doing this, a single epitaxial layer is grown with the lower portion being of P− conductivity and the upper portion being of N− conductivity because of reduction of the supply of diborane and doping of the epitaxial layer due to the availability of N− impurities from the substrate 10. The N+ impurities outgas from the substrate 10 into the reactor. By controlling the ratio of boron to silicon through regulating the introduction of diborane into the epitaxial reactor, the total thickness of the epitaxial grown layer can be 6 microns with the layer 11 having a thickness of 3 to 3.5 microns and the layer 12 having a thickness of 2.5 to 3 microns. The thickness of the layer 11 is determined by the predetermined period in which diborane is supplied at the higher level relative to the supply of silane.

Furthermore, in another alternative, the epitaxial layer could initially grow with P− conductivity for the total thickness for both the layers 11 and 12. Then, by diffusion, the upper 2.5 to 3 microns of the epitaxially grown layer could be converted to N− conductivity to form the layer 12.

This could be accomplished by diffusing an N dopant impurity such as phosphorous or arsenic, for example, at a concentration level of $10^{19}$ atoms/cm.$^3$ and at a temperature of 1000° to 1200° C. Then, a drive-in cycle at 1000° C. for 5 –6 hours in dry oxygen or inert gas could follow this diffusion.

After the layers 11 and 12 have been formed on the upper surface of the substrate 10, an insulating mask, which is preferably silicon dioxide, is grown on the upper surface of the layer 12. This may be achieved by oxidizing at 970° C. for 60 minutes in steam so as to form approximately 0.5 micron of silicon dioxide on top of the layer 12.

By forming an appropriate opening in the mask by suitable means such as the photoresist technique, for example, a subcollector region 15 of N+ conductivity is formed in the layer 12. Arsenic, for example, may be employed as the N+ impurity for diffusion to form the subcollector region 15 in the N− layer 12. This diffusion may occur at a temperature of 1105° C. to produce a surface concentration of $10^{21}$ atoms/cm.$^3$ in the region 15 with the region 15 having a depth of approximately 1.2 microns. Reoxidation then occurs at 970° C. to close the opening which was formed in the oxide layer for diffusion of the region 15.

An appropriate opening is then formed in the oxide layer, which functions as a mask, by suitable means such as the photoresist technique, for example. An isolation region 14 of P+ conductivity is then formed in the layers 11 and 12.

The P+ region 14 is formed by diffusing boron, for example, through the opening in the insulating mask at a temperature of 1105° C. The diffusion is controlled so that the surface concentration of the region 14 is $4\times10^{20}$ atoms/cm.$^3$ with the region 14 having a depth of 3 microns. After completion of diffusion of the region 14, reoxidation occurs at 970° C.

As will be understood, the opening in the insulating mask is such that the region 14 is produced in a rectilinear or curvilinear form. It should be understood that each of the device sites in the substrate 10 would have one of the regions 14 although only one device is shown in FIGS. 1 and 2. As is well known to one versed in the state of the art, this constitutes an isolation diffusion surrounding any device to be isolated from another.

After removal of the oxide layer, an epitaxial layer 16 of N− conductivity is grown on the layer 12 of the semiconductor structure. The epitaxial layer 16 is fabricated to have a surface concentration in the order of $10^{15}$ atoms/cm$^3$. This may be accomplished by means of a halide reduction or a similar process. For example, the epitaxial layer 16, which has a thickness of about 2 microns, may be fabricated to have a surface concentration in the order of $10^{15}$ atoms/cm.$^3$ by employing the hydrogen reduction of $SiCl_4$ at a temperature of 1150° C. for 18 minutes with a growth rate of 0.1 micron/minute. Thereafter, the substrate 10 is oxidized at 970° C. to form the masking layer of approximately 0.5 micron of silicon dioxide.

By forming an appropriate opening in the insulating mask by suitable means such as the photoresist technique, for example, a region 17 of P+ conductivity is then formed in the layer 16 to complete the isolation channel for the device by cooperation with the region 14. The region 14 has diffused outwardly through a portion of the layer 16 during epitaxial growth of the layer 16.

The region 17 is formed, for example, by diffusing boron at a temperature of 1000° C. The surface concentration of the diffused region 17 is $2\times10^{20}$ atoms/cm$^3$.

After the region 17 has been diffused into the layer 16 and reoxidation at 970° has occurred, an N+ region 18 is formed by diffusion of an N type dopant through another opening in the insulating mask into the layer 16 so as to reach through or link with the N+ subcollector region 15. This occurs due to out diffusion of impurities from the subcollector region 15 into the epitaxial layer 16 during growth of the epitaxial layer 16 and during diffusion of the region 18 whereby there is merging between the reach through region 18 and the N+ subcollector region 15.

The creation of the region 18, which has a depth of about 0.8 micron and a surface concentration of $4\times10^{19}$ atoms/cm.$^3$, is preferably achieved by diffusion of phosphorous from a powder source at a temperature of 1050° C. Then, a 60 minute steam oxidation step at 970° C. closes these openings and provides the oxide layer for subsequent diffusion openings.

A diffusion step is next performed, similar to those already described, in which a base region 19 is formed. The parameters are selected so that the base region 19 meets the out diffusion of the subcollector region 15 to define the collector-base junction. The surface concentration of the impurities in the base region 19 is approximately $3\times10^{19}$ atoms/cm.$^3$ with the diffusion of boron occurring at a temperature of 1050° C. to produce a diffusion having a depth of about 0.6 micron. Reoxidation then occurs at 970° C.

After the formation of the base region 19, an N+ emitter region 21 is formed in the base region 19 by another diffusion. The formation of the emitter region 21 is preferably achieved by the diffusion of arsenic from a powder source at a temperature of 1000° C. to produce a surface concentration of $10^{21}$ atoms/cm.$^3$ with a junction depth of approximately 0.4 micron.

Thereafter, by metallization, a pair of ohmic contacts 22 and 23 is formed in engagement with the base region 19 on opposite sides of the emitter region 21. An ohmic contact 24 is formed on the emitter region 21, and an ohmic contact 25 is formed on the subcollector region 15 through engagement with the region 18. All of the ohmic contacts 22–25 are formed through openings in a silicon dioxide layer 26 on the substrate 10. The layer 26 is the layer that was on the substrate 10 when the emitter region 21 was diffused.

As shown in FIG. 1, the diffusion of the subcollector region 15 is controlled so that the length of the subcollector region 15 extends only slightly beyond the side of the emitter region 21 remote from the N+ region. Therefore, the junction area between the subcollector region 15 and the base region 19 is substantially reduced since the subcollector region 15 does not extend beneath the portion of the base region 19 that is to the right of the emitter region 21 in FIG. 1.

Accordingly, current may flow from the emitter region 21 to the subcollector region 15 through the base region 19 since the subcollector region 15 is disposed completely beneath the emitter region 21. Accordingly, there is no adverse effect on the current carrying capabilities of the transistor formed by the present invention.

Because the epitaxial layer 12 has its thickness selected in accordance with its concentration, which is in the order of $2\times10^{15}$ atoms/cm.$^3$, and the bottom of the base region 19 is at least 1 micron from the top of the layer 12, there is sufficient N− material to prevent punch through of the base region 19 to the P− epitaxial layer 11. If the thickness of the layer 12 were increased, then its concentration could be reduced. Likewise, the distance from the bottom of the base region 19 to the top of the layer 12 can be changed in accordance with the impurity concentration of the layer 16. In other words, if the distance from the bottom of the base region 19 to the top of the layer is increased, then the concentration of the layer 16 can be reduced.

For practical purposes, the layer 12 cannot have a concentration beyond approximately $2\times10^{15}$ atoms/cm$^3$. Therefore, it would be necessary to increase the thickness of the layer 12 if the concentration is reduced. With the concentration of the layer 12 approximately $2\times10^{15}$ atoms/cm.$^3$ and the thickness of 2.5 microns, the break down voltage is in the range of 10 to 12 volts. This is sufficient to insure that there is no punch through from the base region 19 to the layer 11 whereby the transistor would be shorted.

The layer 12 must be capable of sustaining a minimum break down voltage of 4 volts. Therefore, any reduction in the thickness of the layer 12 must be appropriately selected in accordance with the minimum break down voltage and/or the impurity concentration of the layer 12.

Figure 3:
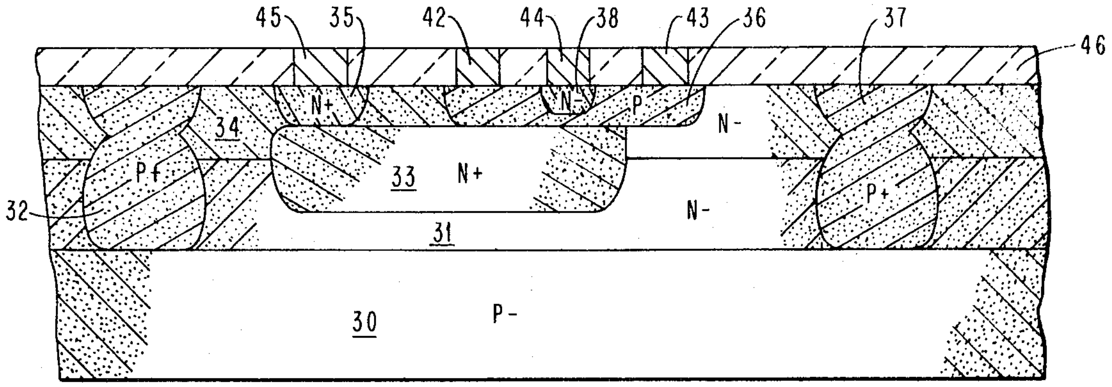
FIG. 3 is a sectional view of another form of the monolithic semiconductor structure of the present invention.
Figure 4:
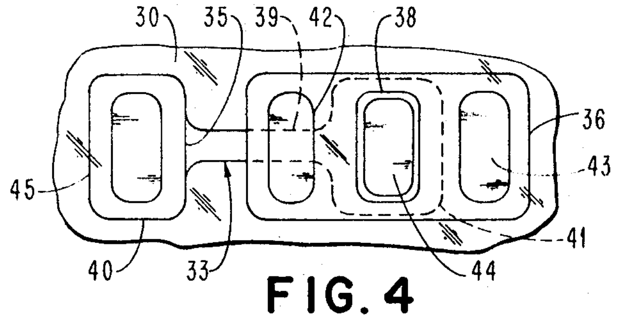
FIG. 4 is a top plan view of a portion of the semiconductor structure of FIG. 3.

Referring to FIGS. 3 and 4, there is shown another form of the semiconductor structure in which a substrate 30 of P− conductivity has a layer 31 of N− conductivity on its upper surface. Thus, in this embodiment, there is no necessity for an epitaxial layer of P− conductivity on top of the upper surface of the substrate 30 in view of the substrate 30 being of P− conductivity.

The N− layer 31 may be epitaxially grown on the substrate 30 so that it has the same crystalline structure as the monocrystalline silicon of the substrate 30. The epitaxial layer 31 may be grown by means of a halide reduction or a similar process, for example.

As one specific example of the halide reduction, the epitaxial layer 31 is fabricated to have a concentration in the order to $2\times10^{15}$ atoms/cm.$^3$ by employing hydrogen reduction of $SiCl_4$ at a temperature of 1150° C. at a growth rate of 0.7 micron/minute. Thereafter, the substrate 30 is oxidized at 970° C. to form a layer of silicon dioxide that functions as a mask. This layer has a thickness of approximately 0.5 micron.

Instead of epitaxially growing the layer 31 of N− conductivity on the substrate 30 of P− conductivity, the upper portion of the substrate 30 can be converted from P− conductivity to N− conductivity by diffusion. This diffusion is accomplished by diffusing an N impurity such as phosphorous or arsenic, for example, at a concentration level of $10^{19}$ atoms/cm.$^3$ and at a temperature of 1000° to 1200° C. After diffusion, a drive-in cycle of 1000° C. occurs in dry oxygen or inert atmosphere for 5 to 6 hours. This provides the N− layer 31 with a thickness of 2 to 3 microns.

After the N− layer 31 has been formed on the substrate 30, an isolation region 32 of P+ conductivity is formed in the layer 31 in the same manner as the region 14 was formed in the layers 11 and 12 in FIGS. 1 and 2. A subcollector region 33 of N+ conductivity is next formed in the N− layer 31 in the same manner as the subcollector region 15 was formed in FIGS. 1 and 2.

Then, an epitaxial layer 34 of N− conductivity is grown on the layer 31. The layer 34 would be grown in the same manner as the layer 16 in FIGS. 1 and 2.

After the layer 34 is grown on the layer 31, a P+ region 37, which links with the region 32 to form the isolation channel of the transistor, is diffused into the layer 34. This is accomplished in the same manner as the region 17 in FIGS. 1 and 2.

An N+ region 35, which reaches through to the subcollector region 33 and is of N+ conductivity, is next diffused into the layer 34. This is accomplished in the same manner as previously described for the N+ region 18 in FIGS. 1 and 2.

Thereafter, a base region 36 is diffused into the layer 34 in the same manner as the base region 19 in FIGS. 1 and 2. An emitter region 38 of N+ conductivity is then diffused into the base region 36 in the same manner as the emitter region 21 in FIGS. 1 and 2.

In forming the subcollector region 33, the mask through which the diffusion occurs is constructed with an opening so that the subcollector region 33 is formed in the shape shown in FIG. 4. Thus, the subcollector region 33 has a reduced portion 39 connecting end portions 40 and 41, which are larger than the portion 39, to each other. The portion 39 of the subcollector region 33 is substantially smaller than the width of the base region 36.

The portion 40 makes contact with the reach through region 35. The portion 40 has substantially the same width as the reach through region 35 and the base region 36.

The portion 41, which is disposed beneath the emitter region 38, has a slightly larger area than the area of the emitter region 38. This allows for misalignment in photolitographic processes between the emitter region 38 and the portion 41 and yet obtains the region 38 wholly entrained in the portion 41. However, the width of the portion 41 is less than the width of the base region 36.

Accordingly, this shape of the subcollector region 33 substantially reduces the junction area between the base region 36 and the subcollector region 33. As a result, the parasitic collector to base capacitance is reduced in comparison with the capacitance of the semiconductor structure of FIGS. 1 and 2. Of course, the series resistance of the subcollector region 33 increases in comparison with the semiconductor structure of FIGS. 1 and 2 because of the decrease in the total area of the subcollector region 33. However, this increase in the resistance of the subcollector region 33 does not reduce the switching speed to the same extent as the switching speed is increased due to the smaller collector to base capacitance.

The base region 36 has ohmic contacts 42 and 43 disposed on opposite sides of the emitter region 38. The emitter region 38 has an ohmic contact 44, and the reach through region 35 has an ohmic contact 45 thereon. All of the ohmic contacts 42–45 may be formed by metallization in the well-known manner through openings in a silicon dioxide layer 46 on the substrate 30. The layer 46 is the layer that was on the substrate 30 when the emitter region 44 was diffused.

Figure 5:
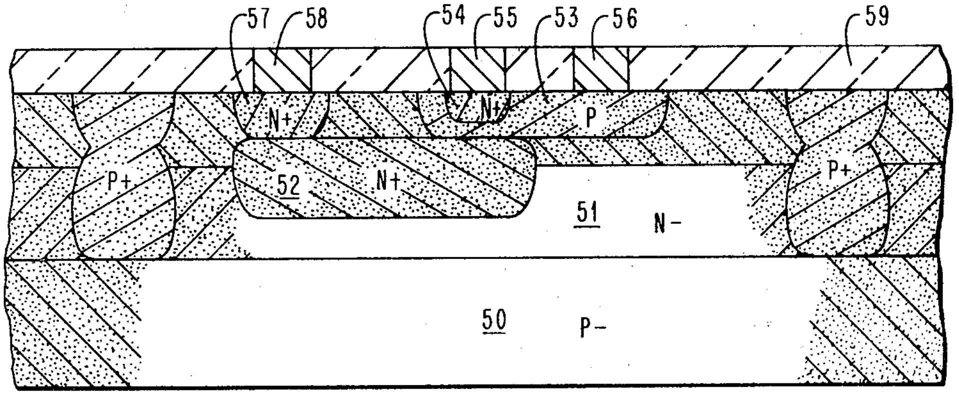
FIG. 5 is a sectional view of still another form of the monolithic semiconductor structure of the present invention.
Figure 6:
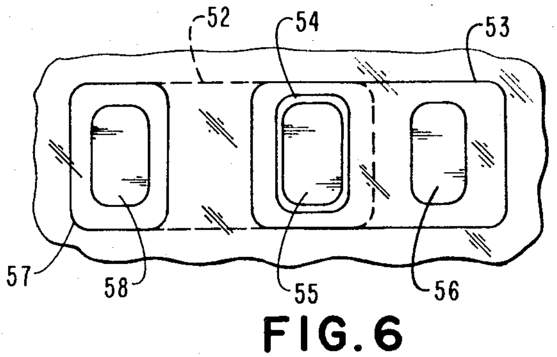
FIG. 6 is a top plan view of the semiconductor structure of FIG. 5.

Referring to FIGS. 5 and 6, there is shown another form of semiconductor structure. A substrate 50, which is monocrystalline silicon and has the same conductivity and concentration as the substrate 30, has a layer 51 of N− conductivity formed thereon in the same manner as the layer 31 has been described as being formed on the substrate 30.

The remainder of the steps in forming the semiconductor structure of FIGS. 5 and 6 is similar to that in forming the semiconductor structure of FIGS. 3 and 4 except that a subcollector region 52 and a base region 53 are made smaller since the base region 53 requires only a single ohmic contact. Thus, the overlying junction area between the base region 53 and the subcollector region 52 is only slightly larger than emitter region 54 as shown in FIG. 6.

The emitter region 54 has an ohmic contact 55, the base region 53 has an ohmic contact 56 on the side of the emitter region 54 away from a reach through region 57 for the subcollector region 52, and the reach through region 57 has an ohmic contact 58. The ohmic contacts 55, 56, and 58 may be formed by metallization in the well-known manner through openings in a silicon dioxide layer 59 on the substrate 50. The layer 59 is the layer that was formed on the substrate 50 when the emitter region 54 was diffused.

The arrangement of the semiconductor structure of FIGS. 5 and 6 obtains all of the advantages of a pedestal structure without the additional processing steps of the second diffusions which are required for the subcollector and the isolation channels beyond the diffusions utilized in forming the structure of FIGS. 5 and 6. Thus, the very small junction area between the base region 53 and the subcollector region 52 decreases the parasitic collector to base capacitance.

Figure 7:
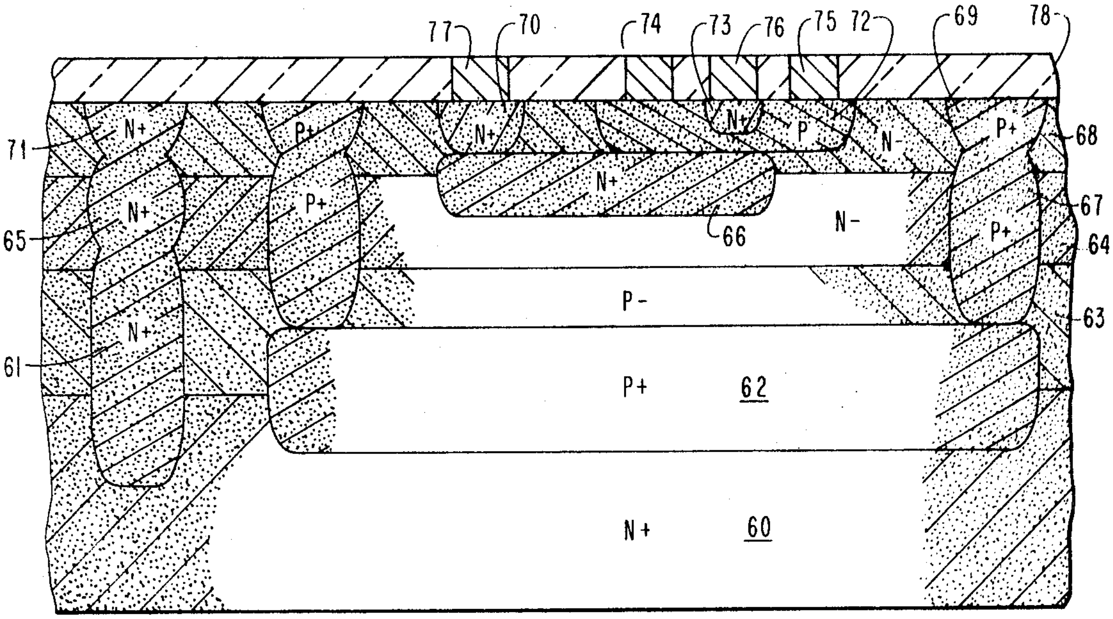
FIG. 7 is a sectional view of a further form of monolithic semiconductor structure of the present invention.

Referring to FIG. 7, there is shown another semiconductor structure of the present invention. The structure includes a substrate 60, which is monocrystalline silicon and has the same conductivity and concentration as the substrate 10.

After the formation of a silicon dioxide layer on the surface of the substrate 60 and formation of an opening therein, an N+ region 61, which functions as part of a power channel, is formed in the substrate 60 by diffusion of phosphorous, for example, through the opening in the mask at a temperature of 970° C. The phosphorous is preferably diffused from $POCl_3$ in a open tube reacting apparatus. This results in the region 61 having a depth of approximately 1 micron in the substrate 60 with a surface concentration of about $3\times10^{20}$ atoms/cm$^3$. Reoxidation then occurs at 970° C. to close the opening in the layer of silicon dioxide.

An opening is then formed in the insulating mask by the photoresist technique, for example, and boron, for example, is diffused therethrough at a temperature of 1105° C. to form a decoupling capacitor region 62 of P+ conductivity in the N+ substrate 60. The decoupling capacitor region 62 has a surface concentration of $8\times10^{19}$ atoms/cm.$^3$ and a depth of approximately 1.5 microns.

After the regions 61 and 62 have been diffused into the substrate 60, a layer 63 P− conductivity is grown on the upper surface of the substrate 60 with a layer 64 of N− conductivity on top of the layer 63. The layers 63 and 64 may be epitaxially grown in substantially the manner described for the layers 11 and 12 of FIG. 1, for example. However, the ratio of boron to silicon need only be in the order of $10^{'7E'7}$ to $10^{'7E'8}$ throughout the growth of the epitaxial layer, which forms the layers 63 and 64, because of the out diffusion of P impurities from the P+ region 62.

After the epitaxial layers 63 and 64 have been grown on the substrate 60, a layer of silicon dioxide having a thickness of about 0.5 micron is thermally grown at a temperature of 970° C. Then, an N+ region 65 is formed by diffusion through an opening in the silicon dioxide layer on the substrate into the N− layer 64 and makes contact with the N+ region 61 due to the out diffusion of the N+ region 61 from the substrate 60 through the layer 63 of P− conductivity. It should be understood that the region 61 out diffuses during the growth of the layer 63 as well as during diffusion of the N+ region 65 and any subsequent thermal processing.

The N+ region 65 is formed by diffusion of phosphorous, for example, at a temperature of 970° C. and preferably from $POCl_3$ in the same manner as the N+ region 61. The surface concentration of the phosphorous in the N+ region 65 is $1.2\times10^{21}$ atoms/cm$^3$. The depth of the N+ region 65 is approximately 3 microns.

After diffusion of the N+ region 65, reoxidation occurs at 1050° C. Then, a subcollector region 66 is diffused into the layer 64. This diffusion may be in the same manner as described for the diffusion of the subcollector region 15 into the epitaxial layer 12 in FIGS. 1 and 2.

After reoxidation following formation of the subcollector region 66, an opening is formed in the oxide layer by the photoresist technique, for example, whereby boron, for example, may be diffused into the N− layer 64 to form an isolation region 67 of P+ conductivity. The diffusion is at a temperature of 1105° C. and produces a surface concentration of $4\times10^{20}$ atoms/cm.$^3$ in the region 67. The region 67 has a depth of 3 microns and contacts the decoupling capacitor region 62, which out diffuses during the time of the diffusion of the isolation region 67 as well as during the formation of the layer 64, during epitaxial growth of an N− layer 68 and during N+ diffusions of the regions 65 and 66. After completion of diffusion of the region 67, reoxidation occurs at 970° C.

The epitaxial layer 68 of N− conductivity is then grown on the layer 64 of N− conductivity. The growth of the layer 68 is in the same manner as described for the layer 16 of FIGS. 1 and 2.

An isolation region 69 is then diffused into the layer 68 by forming an opening in the silicon dioxide layer, which has been grown on the layer 68 after formation of the layer 68, by the photoresist technique, for example. The isolation region 69 may be formed by diffusing boron, for example, at a temperature of 1000° C. to produce a surface concentration of $2\times10^{20}$ atoms/cm.$^3$. The isolation region 69 of P+ conductivity makes contact with the isolation region 67 due to out diffusion thereof during the growth of the N− layer 68 and diffusion of the isolation region 69.

After reoxidation at 970° C., openings are formed in the silicon dioxide layer, which functions as a mask, to cause simultaneous diffusions of phosphorous to form a reach through region 70 and a power channel region 71 of N+ conductivity. The diffusions of the reach through region 70 and the power channel region 71 occur at a temperature of 1050° C. and produce a surface concentration in each of the regions of $4\times10^{19}$ atoms/cm.$^3$. Each of the regions 70 and 71 has a depth of about 0.8 micron.

The subcollector region 66 out diffuses from the layer 64 into the layer 68 during growth of the layer 68 and during diffusion of the reach through region 70. As a result, contact is made between the subcollector region 66 and the reach through region 70.

During growth of the N− layer 68, the power channel region 65 out diffuses from the layer 64. Furthermore, there is out diffusion of the power channel region 65 during diffusion of the power channel region 71 into the layer 68. As a result, the power channel region 71 makes contact with the power channel region 65 during diffusion of the power channel region 71.

After diffusion of the reach through region 70 and the power channel region 71, reoxidation occurs at 970° C. An opening is then formed in the layer, which functions as a mask, by a suitable photoresist technique, for example. A base region 72 is then diffused through the opening in the same manner as the base region 19 is formed in FIGS. 1 and 2.

After this, an emitter region 73 is diffused into the base region 72 in the same manner as described for FIGS. 1 and 2. The subcollector region 66 is disposed so that it extends only slightly beyond the side of the emitter region 73, which is remote from the reach through region 70. Thus, the same collector to base junction area arrangement exists in this structure as in the structure of FIGS. 1 and 2.

The base region 73 has ohmic contacts 74 and 75 disposed on opposite sides of the emitter region 73. The emitter region 73 has an ohmic contact 76, and the reach through region 70 has an ohmic contact 77 thereon. All of the ohmic contacts 74–77 may be formed by metallization in the well-known manner through openings in a silicon dioxide layer 78 on the substrate 60. The layer 78 is the layer that was on the substrate 60 when the emitter region 73 was diffused.

While the semiconductor structure of FIG. 1 has been shown as having the substrate 10 of N+ conductivity, it should be understood that the substrate could be of P− conductivity in the same manner as the semiconductor structures of FIGS. 3,4 and FIGS. 5,6. When this occurs, it would not be necessary for the structure of FIGS. 1 and 2 to have the layer 11 of P− conductivity on the upper surface of the substrate. The substrate of P− conductivity would have the N− epitaxial layer grown thereon in the manner shown, for example, in FIGS. 3 and 4.

Likewise, it is not necessary for the semiconductor structure of FIGS. 3,4 and FIGS. 5,6 to have the substrate formed of P−conductivity. Instead, it could be of N+ conductivity in the same manner as FIG. 1. In this arrangement, it would be necessary for there to be an epitaxial layer of P− conductivity thereon in the manner shown and described for the semiconductor structure of FIGS. 1 and 2.

As to the structure of FIG. 7, the substrate 60 could be of P− conductivity. However, this would necessitate the power channel having the same type of conductivity as the substrate. Thus, the layer 63 would be omitted and the layer 64 would be grown directly on the upper surface of the substrate which would have the same conductivity as the base region. However, in such a structure, the decoupling capacitor 62 will not be available.

While only one power channel has been shown as being formed by the regions 61, 65, and 71, it should be understood that the substrate 60 may have a plurality of separate power channels formed therein. Thus, there would be a plurality of the regions 61 formed simultaneously through separate openings in the silicon dioxide layer. This also would be applicable to the regions 65 and 71.

It should be understood that each of the substrates preferably has an intrinsic epitaxial layer with a thickness of about 1 micron grown on the surface opposite to the surface on which the various epitaxial layers are formed and diffusion occurs. This intrinsic epitaxial layer is employed to prevent out gassing of impurities from the substrate into the reactor during the various thermal processing steps.

While the present invention has been described as forming a semiconductor device with a monocrystalline substrate of silicon, it should be understood that the monocrystalline substrate could be formed of any semiconductor material. Of course, this would necessitate different processing steps insofar as forming the various regions.

In the claims, the use of the term "extending region" of the substrate refers either to the upper portion of the substrate when the substrate is of the same conductivity as the base region or the epitaxial layer of opposite conductivity on the upper surface of the substrate when the substrate is of a different conductivity than the base region.

An advantage of this invention is that it increases the switching speed of a semiconductor device. Another advantage of this invention is that a pedestal structure may be produced with less processing steps where only one ohmic contact is required for the base region. A further advantage of this invention is that the parasitic collector capacitances of a transistor are reduced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:

a monocrystalline substrate having at least a region extending across a surface of said substrate and of one conductivity;

a first layer on top of said extending region and of opposite conductivity to said extending region, said first layer having the same crystal structure as said substrate;

a second layer on top of said first layer and of the same conductivity as said first layer, said second layer having the same crystal structure as said substrate;

a subcollector region in said first and second layers and having a portion extending to the surface of said second layer;

said subcollector region having the same conductivity as said first layer but of higher impurity concentration;

a base region in said second layer and having a junction with said subcollector region;

an emitter region in said base region and having a junction therewith;

said subcollector region being disposed at least beneath said emitter region;

the side of said subcollector region remote from the portion of said subcollector region extending to the surface of said second layer terminating in substantially the same vertical plane as the side of said emitter region remote from the portion of said subcollector region extending to the surface of said second layer so that the collector-base junction area is substantially less than the area of said base region;

and said first layer having a thickness and an impurity concentration selected in cooperation with the distance of the bottom of said base region from the top of said first layer to prevent any shorting between said base region and said extending region of said substrate.

2. The device according to claim 1 in which:

the width of said subcollector region is reduced between said emitter region and the portion of said subcollector region extending to the surface of said second layer;

and the width of said subcollector region is at least the width of said emitter region beneath said emitter region.

3. The device according to claim 2 in which:

said first layer has a thickness of approximately 2 to 2.5 microns and a concentration in the order of $2\times10^{15}$ atoms/cm.$^3$;

and the bottom of said base region is at least 1 micron from the top of said first layer.

4. The device according to claim 2 in which said base region has ohmic contacts on opposite sides of said emitter region.

5. The device according to claim 2 in which said substrate is silicon.

6. The device according to claim 2 in which:

said extending region is a layer on top of the surface of said substrate;

and said substrate is of the opposite conductivity.

7. The device according to claim 2 in which:

said substrate is of the one conductivity;

and said extending region is part of said substrate.

8. The device according to claim 1 in which:

said first layer has a thickness of approximately 2 to 2.5 microns and a concentration in the order of $2\times10^{15}$ atoms/cm.$^3$;

and the bottom of said base region is at least 1 micron from the top of said first layer.

9. The device according to claim 1 in which said base region has ohmic contacts on opposite sides of said emitter region.

10. The device according to claim 1 in which:

said emitter region is disposed adjacent one end of said base region so that said base region can have only one ohmic contact;

and said emitter region is disposed closer to the portion of said subcollector region extending to the surface of said second layer than is said ohmic contact of said base region.

11. The device according to claim 1 in which said substrate is silicon.

12. The device according to claim 1 in which:

said extending region is a layer on top of the surface of said substrate;

and said substrate is of the opposite conductivity.

13. The device according to claim 1 in which:

said substrate is of the one conductivity;

and said extending region is part of said substrate.

* * * * *